(12) United States Patent
Rohlfing

(10) Patent No.: US 7,094,654 B2
(45) Date of Patent: Aug. 22, 2006

(54) MANUFACTURE OF ELECTRONIC DEVICES COMPRISING THIN-FILM TRANSISTORS

(75) Inventor: Frank W. Rohlfing, Kobe (JP)

(73) Assignee: Koninklijke Philips Electronics N.V., Eindhoven (NL)

( * ) Notice: Subject to any disclaimer, the term of this patent is extended or adjusted under 35 U.S.C. 154(b) by 987 days.

(21) Appl. No.: 10/099,680

(22) Filed: Mar. 15, 2002

(65) Prior Publication Data

US 2002/0137235 A1    Sep. 26, 2002

(30) Foreign Application Priority Data

Mar. 23, 2001    (GB)    ................ 0107410.3

(51) Int. Cl.
*H01L 21/00*    (2006.01)
(52) U.S. Cl. ....................... 438/304; 438/305
(58) Field of Classification Search ............. 438/151, 438/149, 304, 289, 296, 299, 238, 626, 473; 257/369, 314, 296
See application file for complete search history.

(56) References Cited

U.S. PATENT DOCUMENTS

| | | | | |
|---|---|---|---|---|
| 5,130,829 A | | 7/1992 | Shannon | 359/59 |
| 5,256,585 A | * | 10/1993 | Bae | 438/304 |
| 5,610,099 A | * | 3/1997 | Stevens et al. | 438/626 |
| 5,612,234 A | | 3/1997 | Ha | 437/40 |
| 5,691,561 A | * | 11/1997 | Goto | 257/369 |
| 5,786,241 A | | 7/1998 | Shimada | 438/163 |
| 5,834,807 A | * | 11/1998 | Kim | 257/314 |
| 5,866,449 A | * | 2/1999 | Liaw et al. | 438/238 |
| 5,899,732 A | * | 5/1999 | Gardner et al. | 438/473 |
| 5,902,121 A | * | 5/1999 | Goto | 257/369 |
| 6,008,098 A | * | 12/1999 | Pramanick et al. | 438/305 |
| 6,057,243 A | * | 5/2000 | Nagayama | 438/689 |
| 6,140,164 A | | 10/2000 | Zhang | 438/163 |
| 6,180,472 B1 | * | 1/2001 | Akamatsu et al. | 438/301 |
| 6,180,501 B1 | * | 1/2001 | Pey et al. | 438/299 |
| 6,239,458 B1 | * | 5/2001 | Liaw et al. | 257/296 |
| 6,287,926 B1 | * | 9/2001 | Hu et al. | 438/289 |

FOREIGN PATENT DOCUMENTS

| | | |
|---|---|---|
| EP | 0629003 | 12/1994 |
| EP | 1045447 A2 | 10/2000 |

(Continued)

OTHER PUBLICATIONS

"Structural fabrication using caesium chloride island arrays as resist in a fluorocarbon reactive ion etching plasma" by S. Tsuchiya, M, Green and R R A Syms in Electrochemical and Solid-State Letters 3, 44-46 (2000).

(Continued)

*Primary Examiner*—Laura M. Schillinger

(57) ABSTRACT

A method of manufacturing an electronic device including a thin film transistor comprises forming a semiconductor film over an insulating substrate; depositing a first masking layer over the semiconductor film and removing portions of it to form a plurality of holes through it that extend substantially perpendicularly from its upper to its lower surface; patterning the first masking layer in a first pattern; depositing a second masking layer over the first masking layer; patterning the second masking layer to define a second pattern that lies within the area of the first pattern; and implanting the semiconductor film using at least the first masking layer as an implantation mask. A portion of the first masking layer that defines at least some of the holes partially masks the implantation such that the implantation defines source and drain regions, an undoped conduction channel between the source and drain regions, and a field-relief region having a lower doping concentration than does the drain region between the conduction channel and the drain region.

11 Claims, 4 Drawing Sheets

FOREIGN PATENT DOCUMENTS

Figure 1A:
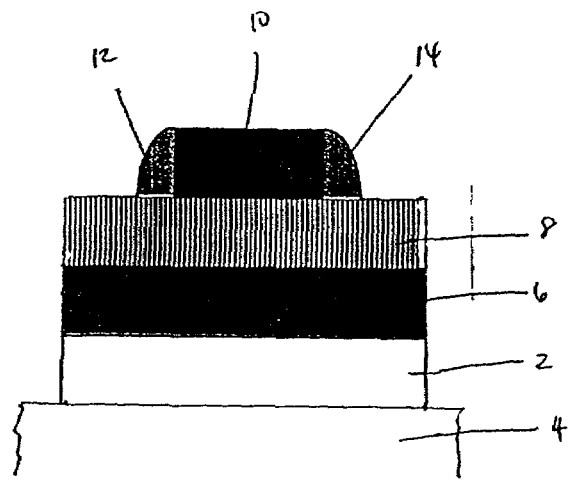

| | | |
|---|---|---|
| GB | 2326019 | 12/1998 |
| JP | 06333941 A | 12/1994 |
| JP | 07131027 A | 5/1995 |
| JP | 08293612 A | 11/1996 |
| JP | 09148266 A | 6/1997 |

OTHER PUBLICATIONS

"Mesoscopic hemisphere arrays for use as resist in structure fabrication" by M Green and T J Tsuchiya, in Vac. Sci. and Tech. B17 2074-2083 (1999).

"Formation of silicon islands on a silicon on insulator substrate upon thermal annealing" by B Leggrannd, V, Agache, J P Nys, V. Senes and D. Stievenard, in Appl. Phys. Lett., 76(22) 3271 (2000).

"Nanostructure array fabrication with a sise-controllable natural lithography" by C. Haginoya, M. Ishibashi and K. Koike, in Appl. Phys. Lett., 71(20 2934 (1999).

"Quantum pillar structures fabicated on $n^+$ gallium arsenide fabricated using 'natural' lithography" by M. Green, M. Gargia-Parajo, F. Khaleque and R. Murray, in Applied Physics Letters 63, 264-266 (1993).

"Micellar inorganic-polymer hybrid systems—a tool for nanlithography" by J P Spatz, T. Herzog, S.J.P. Spatz, T. Herzog, S. Mößmer, P. Ziemann and M. Möller, in Advanced Materials 11(2), 149 (1999).

"Fabrication of quasi-zero-dimensional submicron dot array and capacitance spectroscopy in a GaAs/AlGaAs heterostructure", by H. Fang, R. Zeller and P. J. Stiles, in Applied Physics Letters, 55(14), 1433 (1989).

"Fabrication of silicon cones and pillars using rough metal films as plasma etching masks", by K. Seeger and R.E. Palmer, in Applied Physics Letters, 74 (11), 1627 (1999).

Patent Abstracts of Japan, Dan Toru: "Semiconductor Device And Its Manufacture" Publication No. 0633394, Dec. 2, 1994, Application No. 05116856, May 19, 1993.

* cited by examiner

MANUFACTURE OF ELECTRONIC DEVICES COMPRISING THIN-FILM TRANSISTORS

FIELD OF TECHNOLOGY

This invention relates to electronic devices including thin-film transistors (hereinafter termed "TFTs") on a substrate, for example a glass or insulating polymer substrate. The device may be, for example, an active-matrix liquid-crystal display or other flat panel display, or any other type of large area electronic device with TFTs in a matrix and in a drive circuit, for example, a thin-film data store or an image sensor. The invention also relates to methods of manufacturing such an electronic device.

BACKGROUND AND SUMMARY

For many years there has been much interest in developing thin-film circuits with TFTs on glass and/or on other inexpensive insulating substrates, for large area electronics applications. Such TFTs fabricated with amorphous or polycrystalline semiconductor films may form the switching elements of a cell matrix, for example, in a flat panel display as described in U.S. Pat. No. 5,130,829 (Our Ref: PHB 33646). A more recent development involves the fabrication and integration of circuits from TFTs (often using polycrystalline silicon) as, for example, integrated drive circuits for such a cell matrix. Thus, for example, published European Patent Application EP-A-0 629 003 (Our Ref: PHB 33845) describes such an electronic device comprising on a substrate a switching matrix of thin-film switching transistors and a peripheral drive circuit located outside the matrix and comprising thin-film circuit transistors which are coupled to the switching TFTs of the matrix. The whole contents of U.S. Pat. No. 5,130,829 and EP-A-0 629 003 are hereby incorporated herein as reference material.

Unfortunately, undesirable field-induced effects occur in the transistor characteristics of such TFTs, especially those fabricated with polycrystalline silicon formed using low temperature processes. Several instability mechanisms occur, for example, on-current loss, bias-induced state creation in the polycrystalline silicon, and hot carrier induced state creation and carrier trapping. Another effect which occurs is a drain field-enhanced increase in leakage current. The degradation of the transistor characteristics (for example, off-state leakage current, threshold voltage and on-state current) can seriously limit the use of such TFTs in such circuits.

One way of reducing such effects in TFTs is by means of a field-relief region having a lower doping concentration than the drain region. The TFT comprises an insulated gate adjacent to a crystalline semiconductor film for controlling a conduction channel in the semiconductor film between source and drain regions. The field relief region is present between the conduction channel and drain region of the TFT. It may be located to the side of the gate, or it may be fully or partly overlapped by the gate.

The problem with conventional field-relief architectures is that they require an additional low-dose implantation step. A high-dose implant is needed for the formation of the source and drain, whilst a low-dose implant is required for the field-relief region. Although the introduction of a field-relief region improves TFT performance considerably, the additional implantation step complicates the TFT production process. It is desirable to fabricate the source, drain and the field-relief region in a single implantation step in order to simplify the TFT manufacturing process, which will reduce production costs and improve throughput and yield. This problem is addressed in Japanese Patent Specification No. 9148266 which describes a method of TFT fabrication wherein the edges of the gate electrode are oxidised to form porous films. The porous films are used as a mask to reduce the amount of impurity ions implanted into the active layer and thereby form field relief regions adjacent the source and drain.

It is an aim of the present invention to provide an improved method of defining field relief regions in a single implantation step.

The present invention provides a method of manufacturing an electronic device including a thin film transistor, comprising the steps of:

(a) forming a semiconductor film over an insulating substrate;

(b) depositing a first masking layer over the semiconductor film and removing portions thereof to form a plurality of holes therethrough which extend substantially perpendicularly from the upper to the lower surface thereof;

(c) patterning the first masking layer in a first pattern;

(d) depositing a second masking layer over the first masking layer;

(e) patterning the second masking layer to define a second pattern that lies within the area of the first pattern; and (f) implanting the semiconductor film, using at least the first masking layer as an implantation mask, with a portion of the first masking layer which defines at least some of the holes partially masking the implantation, such that the implantation defines source and drain regions, an undoped conduction channel between the source and drain regions, and a field-relief region having a lower doping concentration than the drain region between the conduction channel and the drain region.

Combined implantation of source, drain and field-relief regions can thus be achieved with the use of a masking layer or template for the definition of the field-relief region, which reduces the implant dose in a controlled fashion relative to the source and drain regions where there is no template.

The first masking layer defines a large number of vertical holes that reach down to the layer beneath, through which the dopant is implanted. The fraction of the template area that is covered with holes determines the effective dopant concentration in the region defined by the template. An increase in the number of holes and a reduction in the hole size will produce a quasi-homogeneous doping profile in the field-relief region, whose doping uniformity can be improved further in a subsequent combined dopant activation and diffusion process using a laser to diffuse the dopant laterally in the molten silicon. The doping dose and distribution can therefore be readily dictated in a controllable manner by selecting a suitable density and size of holes. Techniques which facilitate this are discussed below.

With the approach disclosed in the Japanese Patent Specification No. 9148266 referred to above, the dopant concentration in the field relief regions may only be adjusted relative to the dopant concentration in the source and drain regions by varying the thickness of the oxide layer.

Depending on their number and size, the holes in the template may be prepared using for example lithography or "nanotechnology", that is techniques for defining features having dimensions of the order of nanometers rather than micrometers.

Step (b), that is the formation of a first masking layer over the semiconductor film having a plurality of holes therethrough may comprise providing an array of spaced raised features over the semiconductor film, depositing the first masking layer thereover, and removing the raised features together with the portions of the first masking layer material overlying the raised features. Alternatively, step (b) may comprise depositing a first masking layer over the semiconductor film, defining an etchant mask over the first masking layer, and etching a plurality of holes through the material of the first masking layer.

Step (c), patterning the first masking layer in a first pattern, may be carried out before the step of etching holes in the first masking layer.

In a preferred embodiment of the method, the step of forming holes in the first masking layer is carried out after step (e), such that the holes are formed through the exposed areas of the first masking layer.

The patterning of the first and second masking layers may be achieved in several ways. In a preferred process, step (d) is carried out before step (c), and the method includes a further step (h) after step (d) and before step (c) of patterning the second masking layer to form a mask in the first pattern for the patterning of the first masking layer in step (c). More particularly, wherein step (h) may comprise defining the second pattern in the second masking layer and then forming sidewall spacers adjacent the second masking layer to define the first pattern.

The step (e) of patterning the second layer may comprise defining the second pattern in a third masking layer over the second masking layer, oxidising the exposed portions of the second masking layer, and then removing the oxidised portions of the second masking layer thereby defining the second pattern in the second masking layer.

The use of this oxidation technique or spacers enables the formation of relatively narrow field relief regions, reducing the associated parasitic capacitance and series resistance.

Preferably, the first masking layer may form a gate electrode layer, and the method includes a step of depositing a gate insulator layer after step (a) and before step (b). This enables the formation of fully self-aligned, gate-overlapped lightly-doped-drain (FSA GOLDD) device structures.

Alternatively, the first masking layer forms a gate insulating layer and the second masking layer forms a gate electrode layer.

According to another aspect, the present invention provides an electronic device including a thin film transistor which comprises a patterned semiconductor film on an insulating substrate, a gate insulator layer over the semiconductor film, and a gate electrode over the gate insulator layer, the semiconductor film comprising source and drain regions, an undoped conduction channel between the source and drain regions, and a field-relief region having a lower doping concentration than the drain region between the conduction channel and the drain region, wherein a portion of the gate electrode overlaps the field-relief region and has a plurality of holes defined therethrough which extend substantially perpendicularly from the upper to the lower surface thereof.

In accordance with a further aspect, the present invention provides an electronic device including a thin film transistor which comprises a patterned semiconductor film on an insulating substrate, a gate insulator layer over the semiconductor film, and a gate electrode over the gate insulator layer, the semiconductor film comprising source and drain regions, an undoped conduction channel between the source and drain regions, and a field-relief region having a lower doping concentration than the drain region between the conduction channel and the drain region, wherein a portion of the gate insulator layer overlaps the field-relief region and has a plurality of holes defined therethrough which extend substantially perpendicularly from the upper to the lower surface thereof, and the gate electrode is self-aligned with the conduction channel.

Preferably, the length of the field-relief region is less than 1 µm. The use of, for instance, a spacer technology, oxidation of a patterned mask layer or overetching of a patterned mask layer allow the formation of a relatively narrow field relief region, with a length which may be well below 1 µm.

The holes in the first masking layer may expose around 1 to 10% of the underlying layer with a view to optimising the stability of the TFT. The average hole diameter is preferably less than 100 nm.

The layer definition and implantation methods used to fabricate the TFTs may adopt known technologies and process steps, which will be apparent to those skilled in the art. The source and drain regions and field-relief regions may be doped regions of the one conductivity type present in the semiconductor film, and/or they may be doped regions of one or more additional semiconductor films adjacent to the said semiconductor film. Gate-aligned processes may be used in order to reduce parasitic effects. Thus, for example, at least some of the circuit TFTs may have their field relief region substantially entirely overlapping with the gate, and the gate of these TFTs and/or of other circuit TFTs may have an edge which is substantially aligned with an edge of the drain region.

BRIEF DESCRIPTION OF THE DRAWING FIGURES

Figure 1B:
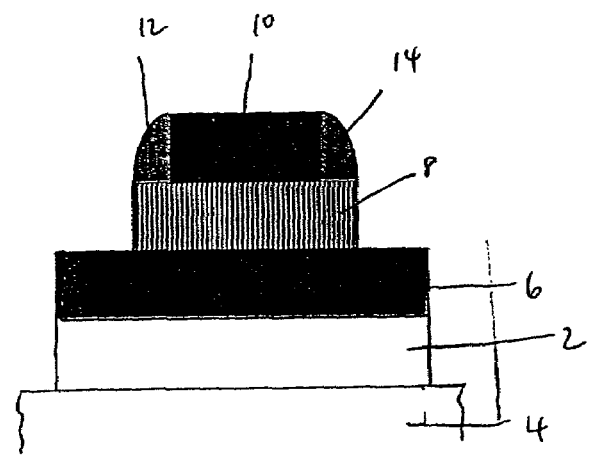
Figure 1C:
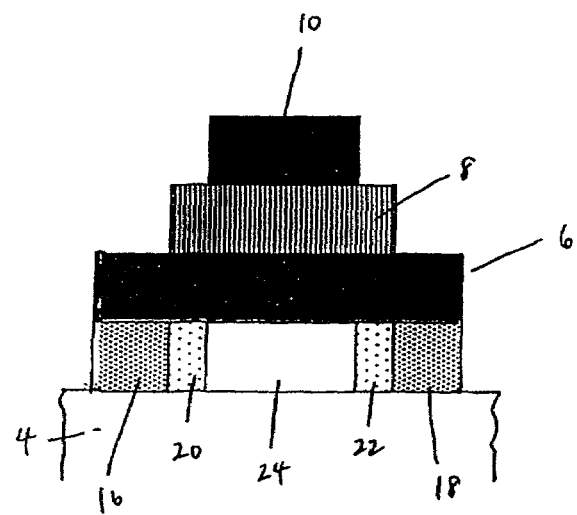
Figure 2A:
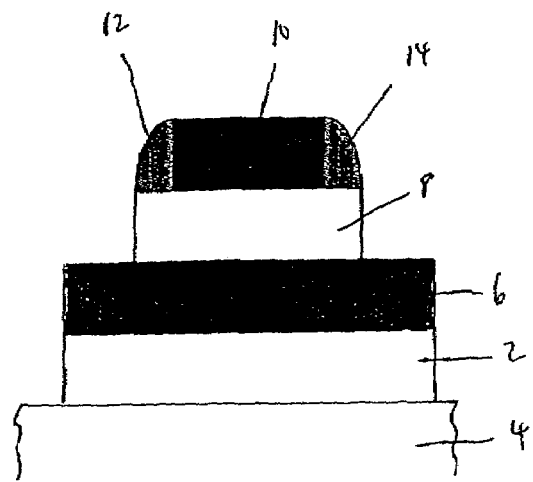

Embodiments of the invention will now be described by way of example and with reference to the accompanying Drawings, wherein:

FIGS. 1A to C show stages in the fabrication of a TFT according to a first embodiment of the invention;

FIGS. 2A and B show stages in the fabrication of a TFT according to a second embodiment of the invention; and FIGS. 3A to C and 4A to C show two examples of techniques for forming a spaced array of holes in a layer.

It should be noted that the Figures are diagrammatic and not drawn to scale. Relative dimensions and proportions of parts of these Figures have been shown exaggerated or reduced in size, for the sake of clarity and convenience in the Drawings.

DETAILED DESCRIPTION

FIG. 1 illustrates a process suitable for fabrication of a range of self-aligned (SA) TFT architectures with field relief, where a masking layer for the implantation of the field-relief regions is formed prior to the definition of the gate.

The structure shown in FIG. 1A may be formed as follows. Firstly, a semiconductor film 2 is deposited over the substrate 4. For example, amorphous silicon may be deposited and then crystallised, typically by irradiation with an energy beam such as a laser. This layer may have a thickness of around 40 nm. A gate insulator layer 6 (for example of silicon dioxide) is subsequently deposited, followed by an insulating layer 8, which constitutes a first masking layer. This layer has a plurality of holes therethrough, the formation of which is discussed below. A gate electrode layer 10 formed typically of an aluminium-titanium alloy is then deposited and patterned (forming a second masking layer), and a spacer 12, 14 made of silicon oxide or nitride for example is formed along each edge thereof.

As illustrated in FIG. 1B, the insulating layer 8 is then etched using the combination of the patterned gate electrode layer 10 and the spacers 12, 14 as a mask.

The spacers are then removed and implantation of the semiconductor film 2 is carried out, with the exposed portions of the perforated insulating layer 8 constituting a first, partial mask, and the gate layer 10 acting as a second mask. This results in the definition of a source 16 and drain 18, field relief regions 20, 22, and a conduction channel 24 in the semiconductor film 2.

Figure 2B:
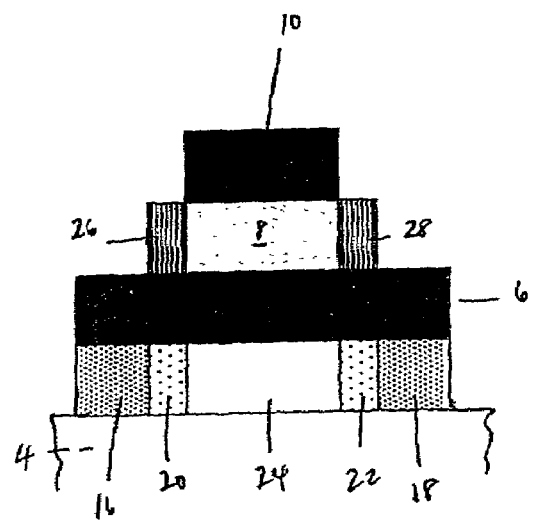

FIG. 2 illustrates an approach to produce SA TFTs with field-relief regions, in which the holes are introduced into the insulating layer 8 after gate definition. As shown in FIG. 2B, the holes are then confined to the exposed portions 26 and 28 of layer 8. Alternatively to the process flow shown in FIG. 2, the holes may be introduced into insulating layer 8 immediately after the definition of gate layer 10, and followed by the steps of spacer 12, 14 fabrication, etching of the insulating layer 8, spacer removal, and ion implantation.

The processes described above in relation to FIGS. 1 and 2 result in fully self-aligned, lightly-doped-drain (FSA LDD) devices. Layers 6 and 8 together form the gate dielectric layers. In those instances, it will be appreciated that layer 6 could be omitted, such that layer 8 alone forms the gate dielectric layer. Alternatively, in FIGS. 1 and 2, layer 8 (representing a first masking layer) could be made of conductive material and form the gate, and layer 10 of insulating material (forming a second masking layer), or another suitable masking material. It can be seen that this will provide fully self-aligned, gate-overlapped lightly-doped-drain (FSA GOLDD) devices. In such processes, layer 8 alone could form the implantation mask. In that case, layer 10 could be removed before the dopant implantation step. In any event, where layer 8 forms the gate layer, layer 10 can be omitted from the finished device.

Typically the doping level in the source and drain regions 16 and 18 may be, for example, $10^{15}$ cm$^{-2}$ or more. The doping level of the field relief regions 20 and 22 may be of the order of $10^{13}$ cm$^{-2}$.

The optimum length of the field-relief regions 20 and 22 for both gate-offset TFTs and the gate-overlap TFTs depends, inter alia, on the length of the channel region 24, the gate and maximum drain operating voltages, and the current levels through the TFT. In a typical example, the length of the field-relief regions 20 and 22 may be in the range of about 1 μm (micrometer) to 3 μm in TFTs which have a length in the range of 5 μm to 10 μm for their channel region 24. With the use of fully self-aligned embodiments, the invention affords relatively narrow LDD regions, whose length may be well below 1 μm.

It will be appreciated that the above processes may be modified in several ways whilst still resulting in FSA devices with field relief regions. For example, instead of using a spacer to define the LDD or GOLDD regions, these regions can be defined by either anodic oxidation or overetching of layer 10, followed by the introduction of holes into layer 8, and the dopant implantation step. SA LDD and SA GOLDD devices can be formed with the processes as well, using two separate masks to define layers 8 and 10.

The uniformity of the dopant in the semiconductor film 2 depends on the size and number of holes in the layer 8. An increase in the number of holes and a reduction in the hole size will produce a quasi-homogeneous doping profile in the field-relief region. If necessary, the dopant uniformity may be improved by a combined dopant activation and diffusion process using an energy beam such as a laser to diffuse the dopant laterally in the semiconductor material.

In order for GOLDD devices to show good stability, the implant dose in the GOLDD region should preferably be more than one order of magnitude lower than that for the source and drain regions. Hence, the fractional area in layer 8 that is covered with holes should be less than 10%. In the GOLDD embodiments, layer 8 forms the gate electrode. The presence of holes in the gate electrode will reduce the gate electric field, compared to the field in the absence of any holes in the layer. However, if the area covered by the holes is less than 10%, the reduction will be negligible.

Figure 3A:
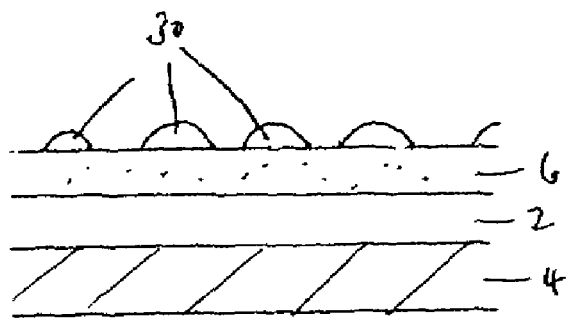
Figure 3B:
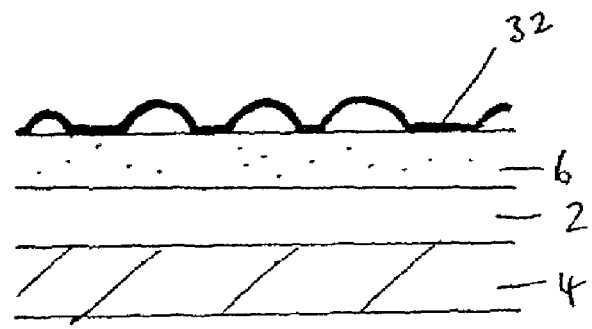
Figure 3C:
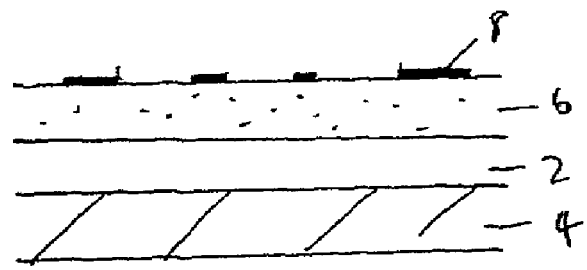

Suitable techniques for use in the formation of the holes will now be described. The process may comprise providing an array of spaced raised features over the semiconductor film, depositing the first masking layer thereover, and removing the raised features together with the portions of the first masking layer material overlying the raised features. One such technique involves the development of a self-assembled array of nano-islands on top of the gate dielectric. The articles "Structural fabrication using caesium chloride island arrays as resist in a fluorocarbon reactive ion etching plasma" by S. Tsuchiya, M. Green, and R. R. A. Syms in Electrochemical and Solid-State Letters 3, 44–46 (2000), and "Mesoscopic hemisphere arrays for use as resist in structure fabrication" by M. Green, and T. J. Tsuchiya, in Vac. Sci. and Tech. B17, 2074–2083 (1999) describe the use of arrays of hemispherical islands of caesium chloride. The process is illustrated in FIG. 3. The islands 30 shown in FIG. 3A are formed by the deposition of a thin caesium chloride film onto a silicon oxide layer 6 via thermal evaporation and a subsequent exposure of the caesium chloride film to water vapour. Film break-up and island formation in the presence of water vapour is driven by the need to minimise the surface free energy. This is followed by the deposition of a gate metal layer 32 over the self-assembled structure as illustrated in FIG. 3B. By means of ultrasonic agitation, for example, the metal film that coated the resist islands can be removed resulting in a gate electrode 8 including holes (FIG. 3C).

Silicon islands can also be used as nano-structured resist masks. An approach of this nature is described in an article entitled "Formation of silicon islands on a silicon on insulator substrate upon thermal annealing" by B. Legrannd, V. Agache, J. P. Nys, V. Senez and D. Stievenard, in Appl. Phys. Left., 76(22), 3271 (2000). This technique involves the heating of a thin film of silicon on silicon oxide to 500 to 900° C. Island formation is believed to be the result of the minimisation of the free energy of the Si/SiO$_2$ system. The gate layer is then deposited over the islands. Ultrasound or etching is applied to remove the islands together with the overlying portions of the gate layer to leave holes in the gate layer.

"Nanostructure array fabrication with a size-controllable natural lithography" by C. Haginoya, M. Ishibashi and K. Koike, in Appl. Phys. Lett., 71(20), 2934 (1999) describes the formation of a hexagonal array of polystyrene balls whose diameter was reduced in a controlled manner by reactive ion etching. A metal film was deposited on top of the array, followed by lift-off of the metal-covered polystyrene balls to form a metal film with hole array.

There has been rapid progress in the fabrication of silicon nano-pillars over large areas in recent years due to the wide range of applications in optoelectronics, single electronics and as field emitters. Diameters range between 5 nm and several micrometers, and pillar heights of 1 μm have been reported. Silicon nano-pillars can also be used for the TFT process flow in FIG. 1 as they enable the fabrication of metal films with an ordered array of nano-holes. This involves the deposition of a silicon film on top of the gate dielectric and its transformation into an array of silicon nano-pillars. The gate metal is then deposited, followed by the removal of the nano-pillars via dry or wet etching. This results in an array of holes in the gate metal whose diameters correspond to those of the nano-pillars. This is disclosed for example in "Quantum pillar structures fabricated on n+ gallium arsenide fabricated using "natural" lithography" by M. Green, M. Garcia-Parajo, F. Khaleque, and R. Murray, in Applied Physics Letters 63, 264–266 (1993).

Alternatively, the hole formation step may comprise the deposition of a first masking layer over the semiconductor film, and then formation of a plurality of holes through the material of the first masking layer. For example, the holes may be formed by defining an etchant mask over the first masking layer, and etching the holes through the first masking layer.

Figure 4A:
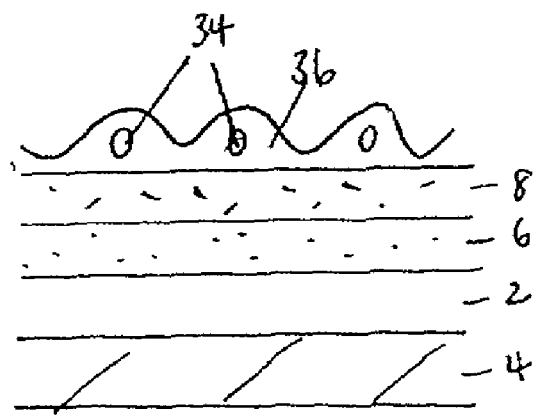
Figure 4B:
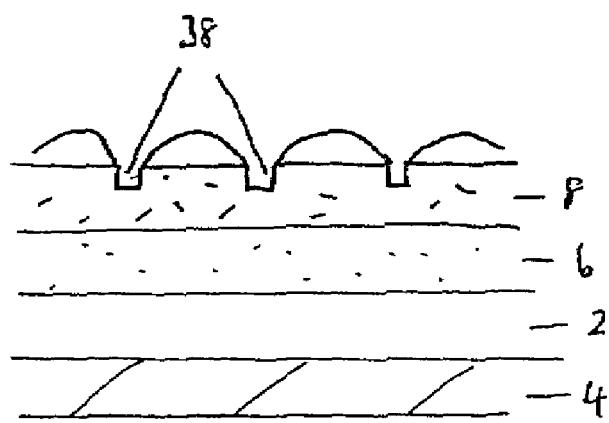
Figure 4C:
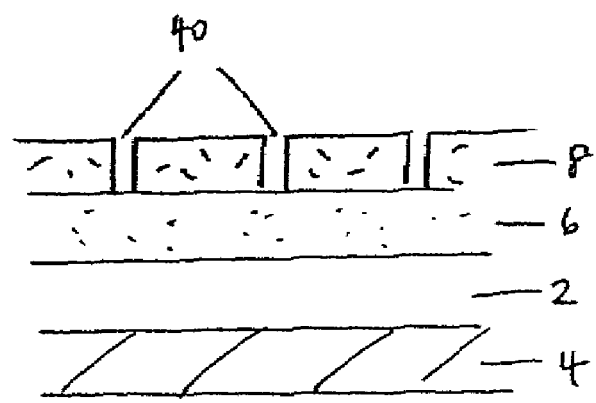

For example, the article "Micellar inorganic-polymer hybrid systems—a tool for nanolithography" by J. P. Spatz, T. Herzog, S. Möβmer, P. Ziemann and M. Möller, in Advanced Materials 11(2), 149 (1999) relates to a method which requires the use of doped semiconductor material for the gate. Holes of 10 nm diameter, separated by 80 nm have been introduced into GaAs (and other semiconductors) using a self-assembled mask of mono-micellar films of diblock copolymer, whereby the micelles were loaded with a suitable transition metal salt. The high etching-rate contrast between the diblock copolymer mask components enables the formation of holes. This process is illustrated in FIG. 4. As shown in FIG. 4A, a micellar film comprising nanoparticles 34 disposed periodically in a diblock copolymer film 36 is deposited over the gate layer 8. The nanoparticles may be formed of gold, and a polystyrene diblock copolymer may be employed, for example. Subsequent sputter etching using an Argon beam for example leads to the formation of recesses 38 and eventually holes 40 in the gate layer, as shown in FIGS. 4B and 4C.

Alternatively, hexagonal arrays of uniform latex particles can be deposited on the doped semiconductor layer, using the latex spheres as a reactive ion etch resist to form an array of hexagonal holes in the semiconductor. This technique is disclosed in "Fabrication of quasi-zero-dimensional submicron dot array and capacitance spectroscopy in a GaAs/AlGaAs heterostructure", by H. Fang, R. Zeller and P. J. Stiles, in Applied Physics Letters, 55(14), 1433 (1989).

A further technique which may be used to form a gate electrode with nano-holes therein is described in "Fabrication of silicon cones and pillars using rough metal films as plasma etching masks", by K. Seeger and R. E. Palmer, in Applied Physics Letters, 74(11), 1627 (1999). When a silver film is deposited via sputter coating, the film grows in the form of three-dimensional silver clusters (approximately 20–40 nm across) rather than in a layer-by-layer mode. Sputtering of a silver cluster film followed by etching thereof enables the formation of a silver film with nano-structured holes, which can be used as the gate material.

The whole contents of the articles referred to above are hereby incorporated herein as reference material.

From reading the present disclosure, other variations and modifications will be apparent to persons skilled in the art. Such variations and modifications may involve equivalent and other features which are already known in the design, manufacture and use of electronic devices comprising thin-film circuits, semiconductor devices, and component parts thereof, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention. Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

The invention claimed is:

1. A method of manufacturing an electronic device including a thin film transistor, comprising the steps of:
   (a) forming a semiconductor film over an insulating substrate;
   (b) depositing a first masking layer over the semiconductor film and removing portions thereof to form a plurality of holes therethrough which extend substantially perpendicularly from the upper to the lower surface thereof;
   (c) patterning the first masking layer in a first pattern;
   (d) depositing a second masking layer over the first masking layer;
   (e) patterning the second masking layer to define a second pattern that lies within the area of the first pattern; and
   (f) performing an implantation in the semiconductor film using at least the first masking layer as an implantation mask to define source and drain regions, an undoped conduction channel between the source and drain regions, and a field-relief region having a lower doping concentration than the drain region between the conduction channel and the drain region.

2. A method of claim 1 wherein step (b) comprises providing an array of spaced raised features over the semiconductor film depositing the first masking layer thereover, and removing the raised features together with the portions of the first masking layer material overlying the raised features.

3. A method of claim 1 wherein step (b) comprises depositing a first masking layer over the semiconductor film defining an etchant mask over the first masking layer, and etching a plurality of holes through the material of the first masking layer.

4. A method of claim 3 wherein step (c) is carried out before the step of etching holes in the first masking layer.

5. A method of claim 3 wherein the step of etching holes in the first masking layer is carried out after step (e), such that the holes are formed through the exposed areas of the first masking layer.

6. A method of claim 1 wherein step (d) is carried out before step (c), and the method includes, after step (d) and before step (c), patterning the second masking layer to form a mask in the first pattern for the patterning of the first masking layer in step (c).

7. A method of claim 6 wherein step (h) comprises defining the second pattern in the second masking layer and then forming sidewall spacers adjacent the second masking layer to define the first pattern.

8. A method of claim 1 wherein step (e) comprises defining the second pattern in a third masking layer over the second masking layer oxidising the exposed portions of the second masking layer, and then removing the oxidised portions of the second masking layer thereby defining the second pattern in the second masking layer.

9. A method of claim 1 wherein the first masking layer forms a gate insulating layer and the second masking layer forms a gate electrode layer.

10. A method of claim 1 wherein the first masking layer forms a gate electrode layer, and the method includes a step of depositing a gate insulator layer after step (a) and before step (b).

11. An electronic device including a thin film transistor fabricated according to a method of claim 1.

* * * * *